March 11, 1969 M. P. XYLANDER 3,432,831

GATED DIFFERENCE AMPLIFIER

Filed Feb. 8, 1965

INVENTOR
MELVIN P. XYLANDER

BY John C Black
ATTORNEY

United States Patent Office 3,432,831
Patented Mar. 11, 1969

3,432,831
GATED DIFFERENCE AMPLIFIER

Melvin P. Xylander, Apalachin, N.Y., assignor to International Business Machines Corporation, New York, N.Y., a corporation of New York Filed Feb. 8, 1965, Ser. No. 430,831
U.S. Cl. 340—174 4 Claims
Int. Cl. G11b *5/00;* H03f *1/00, 21/00*

ABSTRACT OF THE DISCLOSURE

A gated difference amplifier effectively detects low level signals without noise being introduced during gating. High speed gating transistors are connected in parallel with respective difference amplifier transistors. A common gate signal source causes either the gating transistors or the amplifier transistors to conduct. Switching of the gating transistors causes identical potential shifts at both amplifier output terminals, whereby the potential difference across the output terminals remains constant.

This invention relates to improvements in difference amplifiers and more particularly, to an improved gated difference amplifier which is well-adapted to detect signals in the 3–300 milivolt range and to effectively reject unwanted noise.

In known prior art sense amplifiers which gated low level data signals, the gate control caused a shift in the D.C. level thereby injecting unwanted noise into the system equal to or greater than the sensed signal. To avoid this problem, the data signals were frequently amplified prior to gating. However, relatively large noise signals appearing on the input line or lines were frequently large enough after preamplification to render the gated amplifier ineffective for a period of time.

The improved gated difference amplifier of the present application obviates these problems by gating the data signals before they are amplified, thus rejecting noise signals prior to their amplification. In addition, the gating means has been designed so that it does not inject noise into the output of the difference amplifier.

Accordingly, it is a primary object of the present invention to provide an improved gated difference amplifier.

The primary object is achieved in a preferred embodiment of the present invention by providing a pair of gating transistors, each of which is connected in parallel with a respective one of the pair of difference amplifier transistors. The base electrodes of the gating transistors are connected to a common source of gating potential. When the gate signal is of one polarity, the difference amplifier transistors cause the gating transistors to be reverse biased, and the difference amplifier operates in the usual manner. When the gate signal is of the opposite polarity, the gating transistors turn on simultaneously and reverse bias the difference amplifier transistors. With the difference amplifier transistors reverse biased, signals appearing at the inputs of these transistors are isolated from the amplifier output circuit. The gating transistors are operated below their saturation levels to turn on and off at very high speeds, for example, 50 nanoseconds, and do not inject noise into the output. Instead, the turning on of the gating transistors acts in the same manner as a common mode input signal to the difference amplifier. Any shift in potential at the two collector outputs of the difference amplifier in response to the turning on or turning off of the gate transistors, is essentially identical in value and polarity, whereby the potential difference across the output terminals remains constant.

Difference amplifiers of the type contemplated in the present application are frequently used to sense output data from core storage devices and are frequently referred to as sense amplifiers. In one widely-used type of core storage device, each core has associated therewith a pair of selection windings, an inhibit winding which prevents selection of the core, and an output or sense winding. The improved gated difference amplifier of the present application now permits the inhibit winding to also serve the function of a sense winding thereby permitting the elimination of one winding from the core storage device, and resulting in a significant reduction in cost.

Accordingly, it is another important object of the present invention to provide an improved circuit arrangement for supplying inhibit pulses to a selected winding of a core storage device during one portion of a read/write cycle, and to sense output data signals on the same winding during another portion of the read/write cycle.

A feature of the present application is the use of the plurality of the improved gated difference amplifiers as gating preamplifiers, each for a different section of the core storage device and applying the outputs of the gated preamplifiers to a common difference amplifier, thus permitting substantial economies in the core storage output circuitry.

The foregoing and other objects, features and advantages of the invention will be apparent from the following more particular description of preferred embodiments of the invention, as illustrated in the accompanying drawings.

Figure 1:
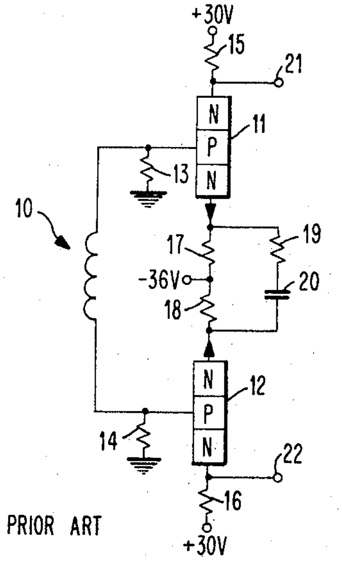
FIG. 1 shows a prior art difference amplifier.

The prior art difference amplifier of FIG. 1 includes a sense line winding 10 opposite ends of which are connected to the base electrodes of a pair of transistors 11 and 12. The base electrodes are also connected to ground potential by way of resistors 13 and 14. The collector electrodes of the transistors are connected to a source of positive bias potential by way of resistors 15 and 16. The emitter electrodes of the transistors are connected to the source of negative bias potential by resistors 17 and 18. A series-connected resistor 19 and a capacitor 20 are connected across the resistors 17 and 18.

When equal potentials are applied to the base electrodes of the transistors 11 and 12, equal potentials will appear at output terminals 21 and 22 of the difference amplifier. When common mode signals appear in the sense line 10, they apply equal potentials to the base electrodes of the transistors 11 and 12 which will shift the potentials appearing at the emiter electrodes an equal amount in the same polarity direction. Thus, the potential across the resistor 19 and the capacitor 20 does not change. As a result, the potential difference across the output terminals 21 and 22 does not change and the common mode signals are rejected.

However, when a data signal appears on the sense winding 10, the voltage applied to one of the base electrodes will be positive going and the voltage to the other base electrode will be negative going, whereby an amplified output difference signal will be provided across the terminals 21 and 22.

It can be readily seen that spurious noise signals appearing on the sense line will appear in amplified form at the output terminals 21 and 22. In applications where low level data signals are to be detected, the signals will be applied to the base electrodes of the transistors 11 and 12 in amplified form by means of preamplifier circuits interposed between the transistors and the sense line. The preamplifiers will also amplify relatively large noise signals which frequently results in swamping of the transistors 11 and 12; that is, driving them heavily into saturation. When the difference amplifier is overdriven in this manner, it requires a certain amount of time for the difference amplifier to restore itself to a normal operating condition for sensing data signals. This time delay frequently results in the loss of data signals as well as the detection of noise signals as data signals.

Figure 2:
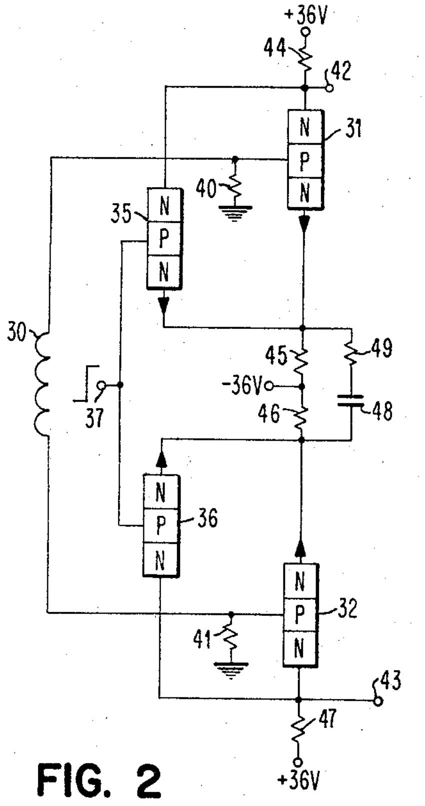
FIG. 2 shows a difference amplifier incorporating the features of the present invention.

The improved difference amplifier of FIG. 2 includes a sense line 30 and a pair of differential transistor amplifiers 31 and 32 which are connected essentially in the same manner as the sense line 10 and the amplifiers 11 and 12 of FIG. 1.

A first gating transistor 35 is provided with its collector electrode connected directly to the collector electrode of the amplifier 31 and its emitter electrode connected directly to the emitter electrode of the amplifier 31. A second gating transistor 36 has its collector and emitter electrodes connected directly to the collector and emitter electrodes of the amplifier 32 respectively.

A source of gate signals (not shown) is coupled to an input terminal 37 which in turn is connected directly to the base electrodes of the transistors 35 and 36. The gate signals have two levels, one of which is negative with respect to ground and the other of which is positive with respect to ground; for example, plus and minus one volt. When a negative gate signal is applied to the input termnial 37, the base-emitter junctions of the transistors 35 and 36 are reverse biased, inasmuch as ground potential is established at the emitter electrodes of the amplifiers 31 and 32 by way of resistors 40 and 41 and the base-emitter junctions of the amplifiers 31 and 32.

When a positive gate signal is applied to the input terminal 37, the base-emitter junctions of the transistors 35 and 36 are forward biased to turn the latter transistors on and to reverse bias the base-emitter junctions of the amplifiers 31 and 32. At this time, input signals from the sense line 30 cannot forward bias the base-emitter junctions of the amplifiers 31 and 32, and the signals are rejected. Turning on of the transistors 35 and 36 produces equal increases of the same polarity in the voltage levels at the emitter electrodes of the transistors 35 and 36, whereby the potential difference across output terminals 42 and 43 does not vary. Resistors 44, 45, 46 and 47 couple the transistors to a source of operating potential, and output signals are obtained across the transistors 31 and 32, capacitor 48 and resistor 49.

Hence, it can be seen that signals from the sense line can be detected by utilization apparatus (not shown), connected to the output terminals 42 and 43, only while the gate signal at the input terminal 37 is at its negative level.

The gate transistors 35 and 36 are preferably operated as nonsaturating, high speed switching devices; typical rise and fall times for the outputs of these transistors are in the order of 50 nanoseconds, assuming that the input gating pulse has a short transition period. The short duration transition periods assure the rejection of the gating signal at the output terminals 42 and 43 and permit high speed operation of the difference amplifier.

Figure 3:
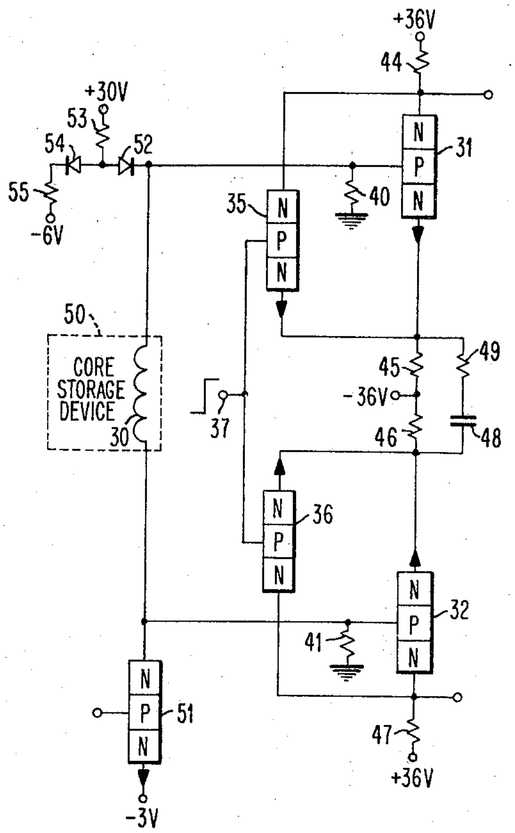
FIG. 3 is a schematic diagram of a core storage device inhibit driver-output sense amplifier incorporating the features of the present invention.

The improved difference amplifier of FIG. 3 is particularly adapted for use with a core storage device, in which the same winding is used as an inhibit winding at one cycle time and as an output sense winding at another cycle time. This circuit includes a portion which is identical to that of FIG. 2 and corresponding components have been given the same reference numerals.

The line 30 is shown as one inhibit-sense winding of a core storage device 50. One end of the winding 30 is connected to the collector electrode of an inhibit driver 51 and the other end of the winding is connected to the cathode of an isolating diode 52; the anode of the diode is connected to a source of positive bias potential by way of an inhibit driver current limiting resistor 53 and to a source of negative bias potential by way of an oppositely poled diode 54 and a resistor 55.

If a positive inhibit pulse is applied to the base electrode of the inhibit driver 51 during a "write" cycle, an inhibit current path is completed through the driver 51, the line 30, the diode 52, and the resistor 53. During the "write" cycle, the gate signal applied to the terminal 37 is at its relatively positive level to reject the inhibit signal in the gated difference amplifier.

When a data pulse is read out of the core storage device 50, during a read cycle, the inhibit driver 51 is nonconducting; and the gate signal at the input terminal 37 is at its relatively negative level so that the data pulse can be applied to the difference amplifiers 31, 32. At this time, the diode 52 is reverse biased so that the inhibit bias supply does not affect the difference amplifier.

Typical values for the components are set forth below; it will be appreciated, however, that they are given by way of example and do not limit the scope of the invention:

| | | Values |
|---|---|---|
| Resistors: | | |
| 13, 14, 40, 41 | ohms | 200 |
| 15, 16, 44, 47 | do | 5,000 |
| 17, 18, 45, 46 | do | 10,000 |
| 19, 49 | do | 30 |
| 53 | do | 100 |
| 55 | do | 15 |
| Capacitors 20, 48 | microfarads | 1 |

It will be appreciated that transistors of the opposite conductivity type may be used in the improved difference amplifiers of FIGS. 2 and 3 by changing the polarities of the bias supplies in a manner well-known to those experienced in the art.

It will also be appreciated that the improved difference amplifier may be used as a preamplifier for a respective section in a core storage device and that the outputs of several of these preamplifiers may be connected in common to the input of an additional difference amplifier for selectively gating output data from the several sections of storage into the same common differential amplifier. This will achieve a significant cost reduction in a high quality core storage arrangement.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a sense amplifier of the type in which a first pair of transistors, each having base, emitter and collector electrodes, are operated as a difference amplifier to detect data signals applied to the base electrodes, the combination with the difference amplifier of a second pair of transistors each having base, emitter and collector electrodes, the emitter and collector electrodes of one of the second pair of transistors being connected directly to the emitter and collector electrodes respectively of one of the first pair of transistors, the other emitter electrodes being connected directly to each other and the other collector electrodes being connected directly to each other, the base electrodes of the second pair of transistors responsive to bivalued control signals from a common source for rendering the first pair of transistors nonconductive when the control signals are at a predetermined one of their two values.

2. In a sense amplifier of the type in which a first pair of transistors, each having base, emitter and collector electrodes, are operated as a difference amplifier to detect data signals applied to the base electrodes, the combination with the difference amplifier of a second pair of transistors each having base, emitter and collector electrodes, the emitter and collector electrodes of one of the second pair of transistors being connected directly to the emitter and collector electrodes respectively of one of the first pair of transistors, the other emitter electrodes being connected directly to each other and the other collector electrodes being connected directly to each other, the base electrodes of the second pair of transistors responsive to control signals for rendering themselves conductive and the first pair of transistors nonconductive.

3. In a core storage device of the type in which inhibit pulses selectively control the entry of data into storage, in which a sense line is energized to remove data from storage, and in which a first pair of transistors, each having base, emitter and collector electrodes, are operated as a difference amplifier to detect data signals applied to their base electrodes by opposite ends of the sense line, the combination with the difference amplifier and the sense line of a second pair of transistors each having base, emitter and collector electrodes, the emitter and collector electrodes of one of the second pair of transistors being connected directly to the emitter and collector electrodes respectively of one of the first pair of transistors, the other emitter electrodes being connected directly to each other and the other collector electrodes being connected directly to each other, the base electrodes of the second pair of transistors responsive to bivalued control signal from a common source for rendering the first pair of transistors nonconductive when the control signals are at a predetermined one of their two values, and means including a transistor switch connected to the sense line for applying inhibit pulses to the latter at selected intervals.

4. In a core storage device of the type in which inhibit pulses selectively control the entry of data into storage during write cycles, in which sense lines are selectively energized during read cycles to remove data from storage, and in which first pairs of transistors, each having base, emitter and collector electrodes, are each operated as a difference amplifier to detect data signals applied to their base electrodes by opposite ends of a respective sense line, the combination with each difference amplifier and sense line of a second pair of transistors each having base, emitter and collector electrodes, the emitter and collector electrodes of one of the second pair of transistors being connected directly to the emitter and collector electrodes respectively of one of the first pair of transistors, the emitter electrodes of the other of the first and second pairs of transistors being connected directly to each other and the collector electrods of the other of the first and second pairs of transistors being connected directly to each other, the base electrodes of the second pair of transistors responsive to control signals during each write cycle for rendering the first pair of transistors nonconductive, and means for selectively applying inhibit pulses to the sense line during write cycles including a transistor switch connected to one end of the sense line and a bias supply circuit connected to the other end of the sense line.

References Cited

UNITED STATES PATENTS

| | | | |
|---|---|---|---|
| 3,329,940 | 7/1967 | Barnes et al. | 340—174 |
| 3,042,876 | 7/1962 | Pegram | 330—19 |

JAMES W. MOFFITT, *Primary Examiner.*

U.S. Cl. X.R.

330—69